(12) United States Patent
Yui

(10) Patent No.: US 7,298,043 B2
(45) Date of Patent: Nov. 20, 2007

(54) SEMICONDUCTOR DEVICE

(75) Inventor: Takashi Yui, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/375,134

(22) Filed: Mar. 15, 2006

(65) Prior Publication Data

US 2006/0209517 A1   Sep. 21, 2006

(30) Foreign Application Priority Data

Mar. 16, 2005   (JP) .............................. 2005-074179

(51) Int. Cl.
H01L 23/367   (2006.01)
(52) U.S. Cl. ................. 257/713; 257/E23.103
(58) Field of Classification Search ................. 257/675, 257/706, 707, 712, 713, 717, E23.101–E23.113; 438/123
See application file for complete search history.

(56) References Cited

U.S. PATENT DOCUMENTS

2003/0124772 A1*   7/2003   Wright ..................... 438/123

2004/0099933 A1*   5/2004   Kimura ..................... 257/675
2006/0055029 A1*   3/2006   Othieno et al. ............. 257/707

FOREIGN PATENT DOCUMENTS

JP          2001-28410           1/2001
JP          2003007914 A    *   1/2003

* cited by examiner

Primary Examiner—Lynne Gurley
Assistant Examiner—Andrew O. Arena
(74) Attorney, Agent, or Firm—Steptoe & Johnson LLP

(57) ABSTRACT

A semiconductor device having a wiring substrate, a semiconductor element mounted on the wiring substrate via a heat sink, a wire electrically connecting the wiring substrate and the semiconductor element, the wiring substrate having through holes each connected to the wire or the heat sink, and external electrodes formed on a back surface of the wiring substrate and connected to the through holes. An insulating layer is formed between the heat sink and the semiconductor element, and the heat sink is divided into at least two sections. Hence, the back surface of the semiconductor element maintains an electrically disconnected state irrespective of the potential of the heat sink, and the heat dissipation design is allowed greater flexibility. Thus, the external electrodes connected to the heat sink via the through holes are connected to the mounting substrate wirings having satisfactory heat dissipation efficiency, allowing the heat of the semiconductor element to escape efficiently.

4 Claims, 5 Drawing Sheets

SEMICONDUCTOR DEVICE

BACKGROUND OF THE INVENTION

1. Field of the Invention

The present invention relates to a semiconductor device, and in particular, to a semiconductor device having a semiconductor element of large power consumption mounted thereto.

2. Description of the Related Art

In recent years, electronics including information communication devices, office electronics, household electronics, measuring devices, industrial electronics such as assembling robots, medical electronics, and electronic toys have become increasingly smaller and lighter, and it is therefore strongly desired to reduce an actual area for a semiconductor device to be mounted. Examples of devices that have developed in response to such a demand include a BGA (Ball Grid Array) semiconductor device. A semiconductor element mounted on this type of a semiconductor device is desired to realize higher integration and downsizing of the chip, and to respond to high heat generation.

FIG. 5 shows the BGA semiconductor device (see Japanese Laid-Open Patent Application No. 2001-28410) that responds to the high heat generation. A semiconductor element 3 is mounted on a wiring substrate 1 via a heat sink 2, where the surface layer wiring 1a of the wiring substrate 1 and the semiconductor element 3 are electrically connected with a wire 4. External electrodes 6 connected to the surface layer wiring 1a or the heat sink 2 via through holes 5 are formed on the back surface of the wiring substrate 1, and the through holes 5 connected to the heat sink 2 is connected to a solid wiring 7 in the wiring substrate 1, so that high heat generation of the semiconductor element 3 is allowed to escape to the mounting substrate (not shown), to which the external electrodes 6 are connected via the heat sink 2, the through hole 5, the solid wiring 7, and the external electrode 6. The solid wiring is a wiring pattern having an area larger than the normal surface layer wiring (signal wiring). Reference character 8 refers to a mold resin for sealing the element mounting surface of the wiring substrate 1.

In the above semiconductor device, such as the solid wiring and a copper plate disposed on the surface of the wiring substrate 1 are used as the heat sink 2, on which the semiconductor element 3 is directly mounted, and the semiconductor element 3 and the heat sink 2 are at the same potential at the bonding surface. Thus, due to the electrical demand of the semiconductor element 3, that is, since the back surface of the semiconductor element 3 is generally desired either not to be electrically connected or to be at GND potential, the inner solid wiring 7 to which the through hole 5 that is connected to the heat sink 2 is connected is uniquely determined as the GND layer. That is, the through hole 5 connected to the heat sink 2 can only be connected to the GND layer, and the power supply layer cannot be used for heat dissipation even if the power supply layer provided in the wiring substrate 1 similarly as the solid wiring is equal to or greater than the GND layer and is able to efficiently dissipate the heat.

SUMMARY OF THE INVENTION

The present invention aims to provide, in view of the above problems, a semiconductor device in which the heat dissipation efficiency from the semiconductor element is higher.

To achieve the above aim, a semiconductor device is provided in which a semiconductor element is mounted on a wiring substrate via a heat sink, the wiring substrate and the semiconductor element are electrically connected by a wire, the wiring substrate has through holes connected to the wire or the heat sink, and an external electrode connected to each through hole is formed on a back surface of the wiring substrate, wherein an insulating layer is formed between the heat sink and the semiconductor element, and the heat sink is divided into at least two sections. According to the above semiconductor device, the back surface of the semiconductor element maintains an electrically disconnected state irrespective of the potential of the heat sink, and thus the external electrode connected to the heat sink by way of the through hole can be connected to the wiring or the like of the mounting substrate which has satisfactory heat dissipation efficiency to efficiently escape the heat of the semiconductor.

The heat sink may be formed on the wiring substrate simultaneously with a surface layer wiring of the wiring substrate, or may be mounted on the wiring substrate.

The insulating layer may be a solder resist layer, or may be an insulating adhesive layer for adhering the semiconductor element.

In terms of heat dissipation efficiency, the through holes connected to the heat sink are preferably connected to wirings in the substrate. More preferably, the through holes each connected to the divided sections of the heat sink are each connected to a different wiring in the substrate. It is preferable that at least one of the wirings in the substrate to which the heat sink is connected via the through hole is one of a GND wiring and a power supply wiring.

DESCRIPTION OF THE PREFERRED EMBODIMENTS

Hereinafter, description will be given of embodiments of the present invention with reference to the drawings.

Figure 1:
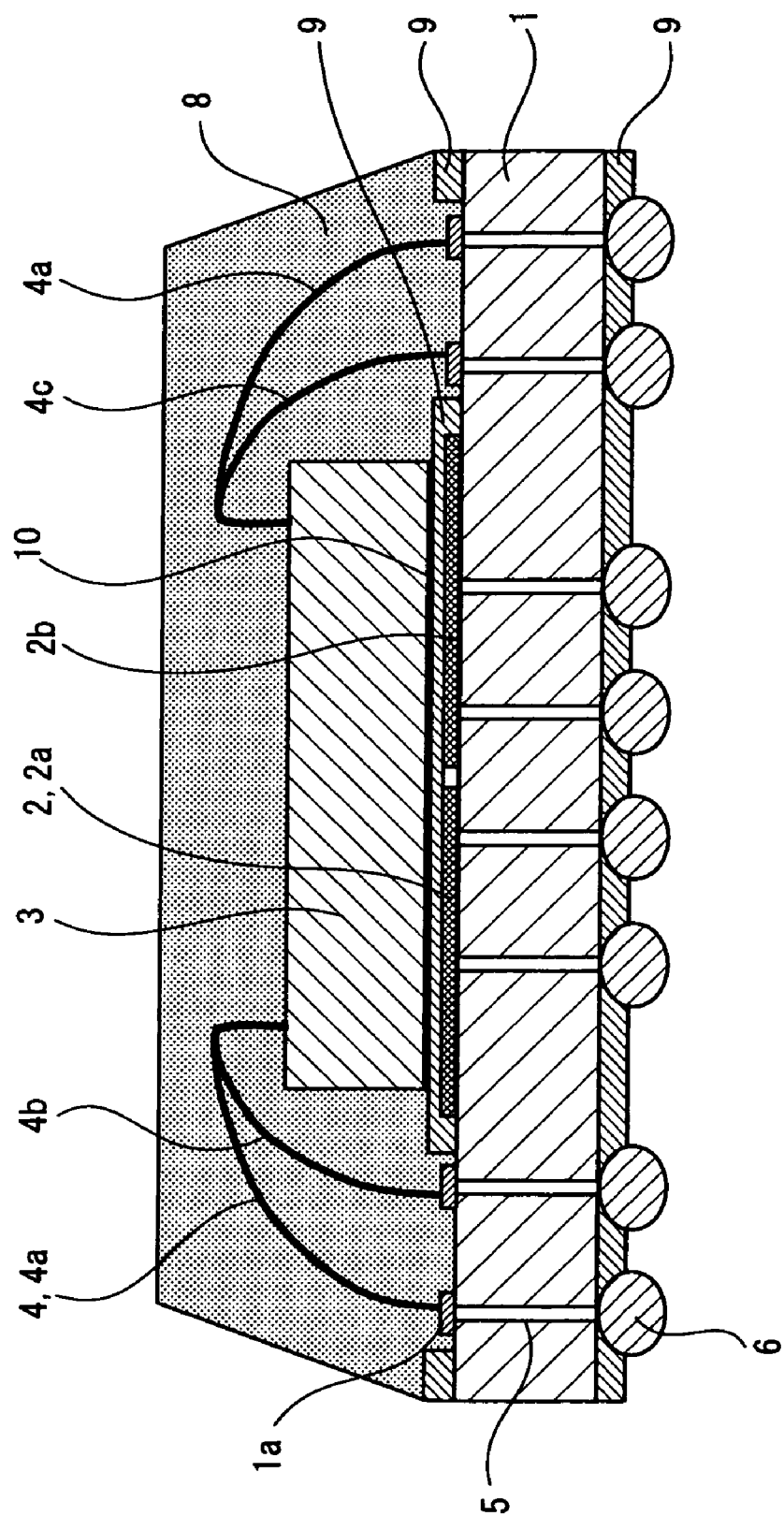
FIG. 1 is a cross-sectional view showing an embodiment of a semiconductor device according to the present invention.

In the semiconductor device shown in FIG. 1, a semiconductor element 3 is mounted on a wiring substrate 1 by way of a heat sink 2, a surface layer wiring 1a of the wiring substrate 1 and the semiconductor element 3 are electrically connected by a wire 4 (a signal wire 4a, a GND wire 4b, and a power supply wire 4c) using a wire bonding method, external electrodes 6 connected to through holes 5, arranged so as to be connected to the surface layer wiring 1a or the heat sink 2, is formed on a back surface of the wiring substrate 1, and the surface of the wiring substrate 1 is sealed with a mold resin 8. Generally, a metal balls such as solder balls is formed as the external electrodes 6.

This semiconductor device differs from the conventional semiconductor device in that the heat sink 2 is divided into at least two heat sinks 2a, 2b, and in that an insulating layer 9 is interposed between the heat sink 2 and the semiconductor element 3. A solder resist is used as the insulating layer 9, which covers the heat sink 2 completely along with an element mounting surface surrounding the heat sink 2 and the back surface of the substrate.

The solder resist is used as the insulating layer 9, because a solder resist layer is formed generally on a mounting surface of an external electrode, and it is advantageously possible to simplify the process by forming the insulating layer 9 at the same time when the solder resist layer is formed. Any material may be used as long as a solder resist is formed. In the case where insulation between the back surface of the semiconductor element 3 and the heat sink 2 is especially important, it is desirable to form the solder resist to have a thickness with which such as pin-holes are not likely formed, specifically, not less than 10 μm. Instead of the solder resist, the insulating resin may be interposed between the heat sink 2 and the semiconductor element 3.

An adhesive 10 for bonding the semiconductor element 3 to the insulating layer 9 may be provided as an adhesive material that is commonly used in mounting the semiconductor element 3 to a substrate such as the wiring substrate 1. The adhesive 10 may be electrically conductive if it is possible to ensure the insulation by the insulating layer 9 without fail. However, when there is a concern that the pin-holes and the like can occur because it is not possible to form the insulating film 9 thick enough, it is desirable to use an insulating adhesive in order to obtain sufficient insulation without fail. Examples of preferred insulating adhesives include Ablestik's Series 2025 adhesives. In order to improve heat characteristics, methods including the following may be adopted: employing a base resin with high thermal conduction efficiency as the adhesive material, and adding an inorganic filler such as silica and aluminum nitride to the adhesive material.

According to the semiconductor device configured as above, the heat generated by operating the semiconductor element 3 is conducted to the heat sink 2 from the back surface of the semiconductor element 3 through the adhesive 10 and the insulating layer 9, further conducted to the external electrodes 6 via the through holes 5, and finally allowed to escape to the mounting substrate (not shown) such as a motherboard to which the external electrodes 6 are connected.

In this semiconductor device, since the insulating layer 9 is formed between the semiconductor element 3 and the heat sink 2, the back surface of the semiconductor element 3 is maintained in an electrically disconnected state irrespective of the connection of the through holes 5 in the substrate to the heat sink 2, or the external connection via the external electrodes 6. In other words, the back surface of the semiconductor element 3 is maintained in a electrically disconnected state irrespective of the potential of the heat sink 2, and thus the external electrodes 6 connected to the heat sink 2 via the through holes 5 can be connected to an arbitrary wiring layer of the motherboard, such as, a wiring layer having the highest heat dissipation efficiency. Consequently, it is not necessary to consider electrical connection when doing thermal design for mounting the device to the motherboard, and to freely do thermal design for efficient heat dissipation in order to obtain high heat dissipation effect. Thus, thermal resistance of the semiconductor device can be reduced, and mounting reliability can be improved.

Bonding reliability may be improved by dividing the heat sink 2 into pluralities (2a, 2b). By making each of the heat sinks 2a, 2b small, displacement at each corner due to thermal expansion becomes small when the heat from the semiconductor element 3 is conducted, and thus the generation of thermal stress is reduced.

The heat sink 2 (2a, 2b) may be formed in a formation step of the wiring substrate 1, as a solid wiring at the same time when the surface layer wiring 1a is formed. In general, metal having high heat conductivity such as Cu is desirable for the heat sink 2, and such metal is used also as a wiring material of the wiring substrate 1, and accordingly, the heat sink 2 can also be formed at the same time as the surface layer wiring 1a. Thus, the number of steps may be reduced, and the semiconductor device of high heat dissipation efficiency may be provided inexpensively.

The heat sink 2 (2a, 2b) may be mounted on the wiring substrate 1 by being cut out from a copper plate. In this case, there is no such restriction as in the case where the heat sink 2 is formed in the formation step of the wiring substrate 1; that is, it is possible to freely use a material different from the wiring material for the wiring substrate 1, or to use the same material but make the heat sink 2 thicker compared to the surface layer wiring 1a of the wiring substrate 1. By this, the heat dissipation design is allowed greater flexibility, and the semiconductor device having higher heat dissipation efficiency may be obtained.

Figure 2:
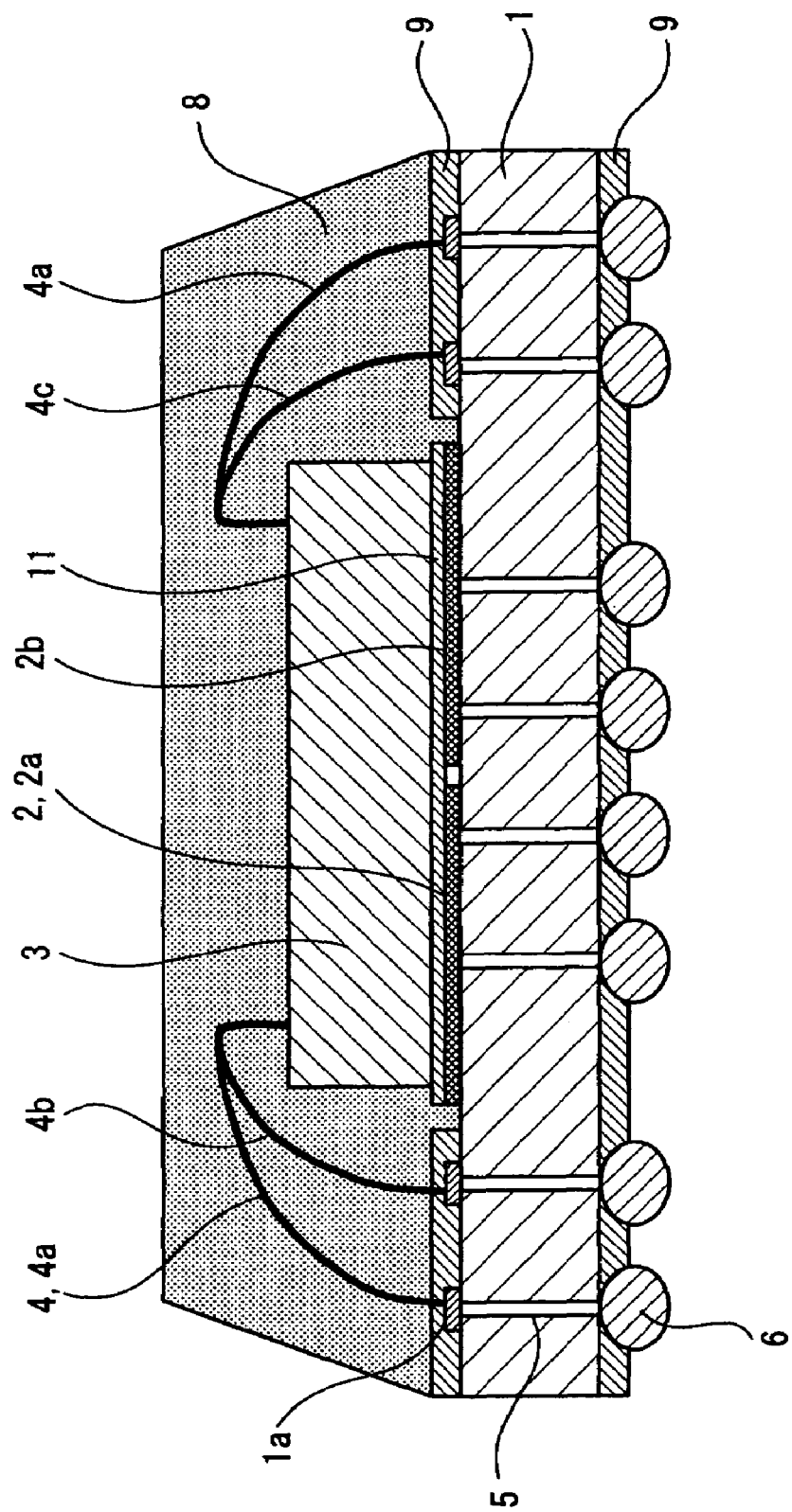
FIG. 2 is a cross-sectional view showing another embodiment of the semiconductor device according to the present invention.

FIG. 2 illustrates the semiconductor device that is different from the semiconductor device shown in FIG. 1 in that the semiconductor element 3 is directly bonded to the heat sink 2 via an insulating adhesive 11. Specifically, the bonding of the semiconductor element 3 to the heat sink 2 is ensured by the insulating adhesive 11, and at the same time, the electrical insulation between the heat sink 2 and the semiconductor element 3 is ensured without using an additional insulating layer. Here, the insulating layer 9 remains on the element mounting surface surrounding the heat sink 2 and the back surface, but the insulating layer 9 may be entirely removed from the element mounting surface.

A resin material and the like of the insulating adhesive 11 is not particularly limited, but a film type material that provides stable thickness and evenness is most suitable for the purpose of the present invention. For instance, LE series by Lintec Corporation is suitably used because of the satisfactory electrical insulation as well as the stability and evenness in thickness thereof. In order to improve the heat characteristics, it is also possible to adopt such a method as employing a base resin with high thermal conduction efficiency as the adhesive material, or adding an inorganic filler such as silica and aluminum nitride to the adhesive material.

According to the semiconductor device configured as above, the heat generated by operating the semiconductor element 3 is conducted to the heat sink 2 from the back surface of the semiconductor element 3 through the insulating adhesive 11, and further conducted to the external electrodes 6 via the through holes 5. With such a configuration, it is possible to obtain heat dissipation effect higher than that of the semiconductor device of FIG. 1. While the heat in the semiconductor device of FIG. 1 is conducted through the thickness of the adhesive 10 and the insulating layer 9, the heat in the semiconductor device of FIG. 2 is conducted only through the thickness of the insulating adhesive 11 and a conduction path of the heat is shorter, thereby improving the heat conduction efficiency to the heat sink 2. The improvement of the heat dissipation effect related to the mounting on the motherboard is the same as the case of the semiconductor device of FIG. 1.

Figure 3:
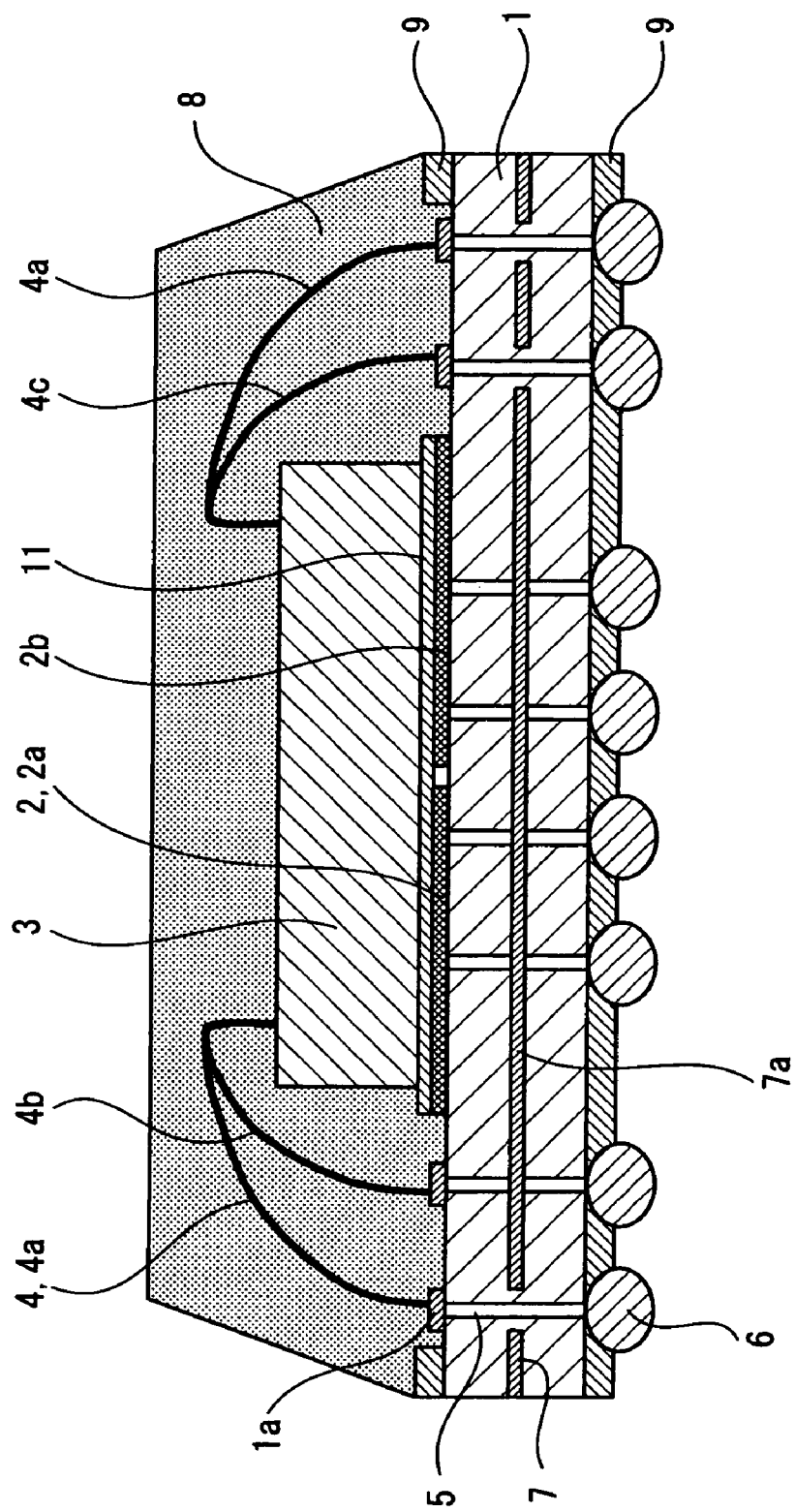
FIG. 3 is a cross-sectional view showing still another embodiment of the semiconductor device according to the present invention.

FIG. 3 illustrates the semiconductor device that is different from the semiconductor device shown FIG. 2 in that the through holes 5 connected to the heat sink 2 are connected to a solid wiring 7a of an inner wiring layer 7 of the wiring substrate 1.

The solid wiring 7a does not necessarily needs to be a wiring that has other electrical connections, and may be a solid wiring that is largest or with highest thermal efficiency selected among wirings. Generally, it is desirable to select a GND wiring or a power supply wiring. In this case, the GND wiring connected to the through holes 5 to which the GND wire 4b is connected is selected.

In this semiconductor device, the heat generated by operating the semiconductor element 3 is conducted to the heat sink 2 (2a, 2b) from the back surface of the semiconductor element 3 through the insulating adhesive 11, and then further conducted through: a conduction path via the through holes 5 to the external electrodes 6 at ends of the respective through holes 5, and another conduction path from the through holes 5 through the solid wiring 7a to the through holes 5 connected with the GND wire 4b, and then to the external electrodes 6.

As described above, the number of conduction paths increases by an addition of the solid wiring 7a, and therefore it is possible to obtain heat dissipation effect higher than that of the semiconductor device of FIG. 2. Further, since the heat concentrated at the external electrodes 6 at the end of the through holes 5 connected directly to the heat sink 2 (2a, 2b) when the solid wiring 7a is not provided is dispersed to a greater number of external electrodes 6, the thermal fatigue of the external electrodes 6 is reduced, and the connection reliability of the external electrodes 6, and in turn, mounting reliability of the semiconductor device can be improved.

Figure 4:
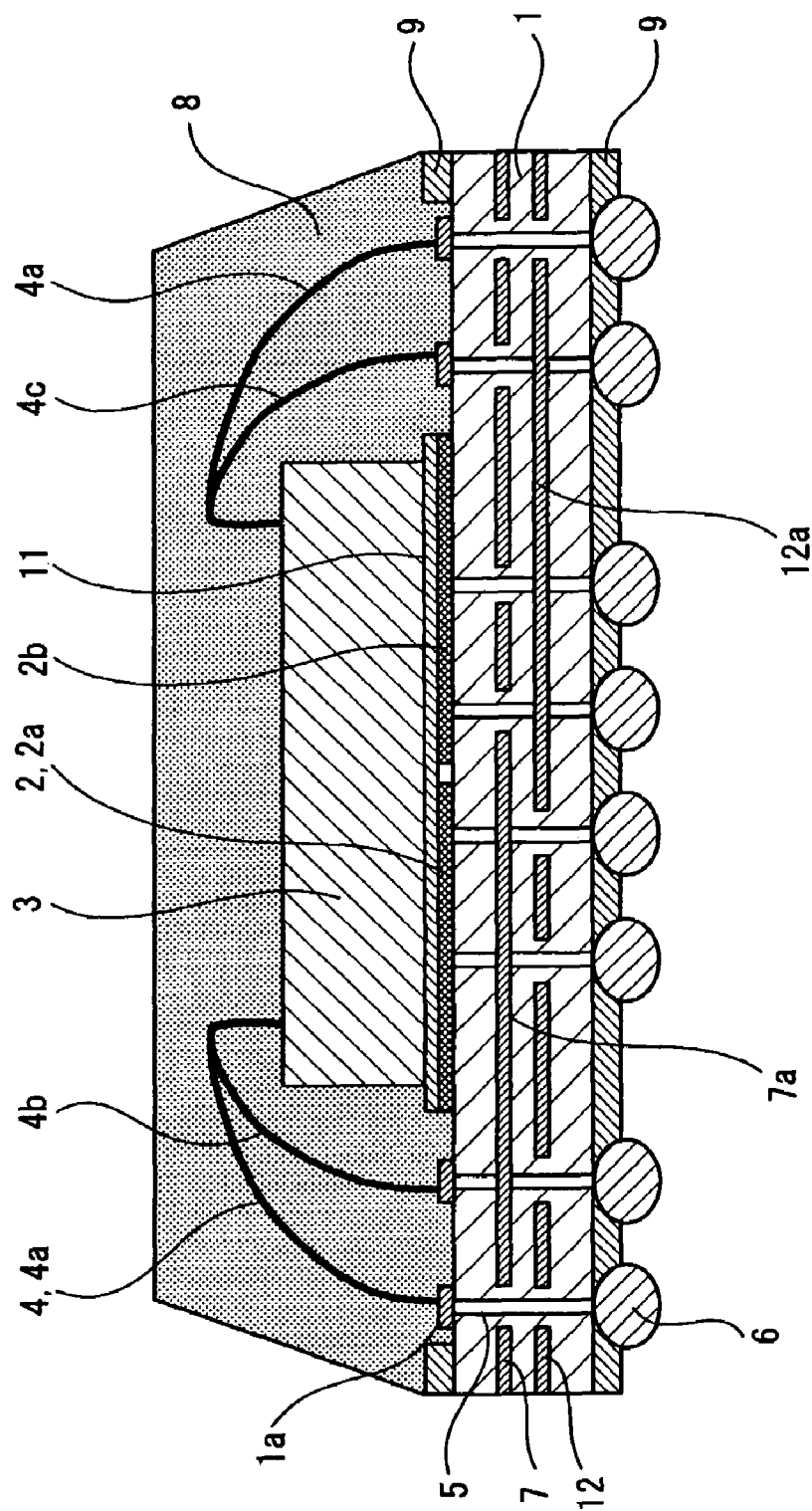
FIG. 4 is a cross-sectional view showing still another embodiment of the semiconductor device according to the present invention.
Figure 5:
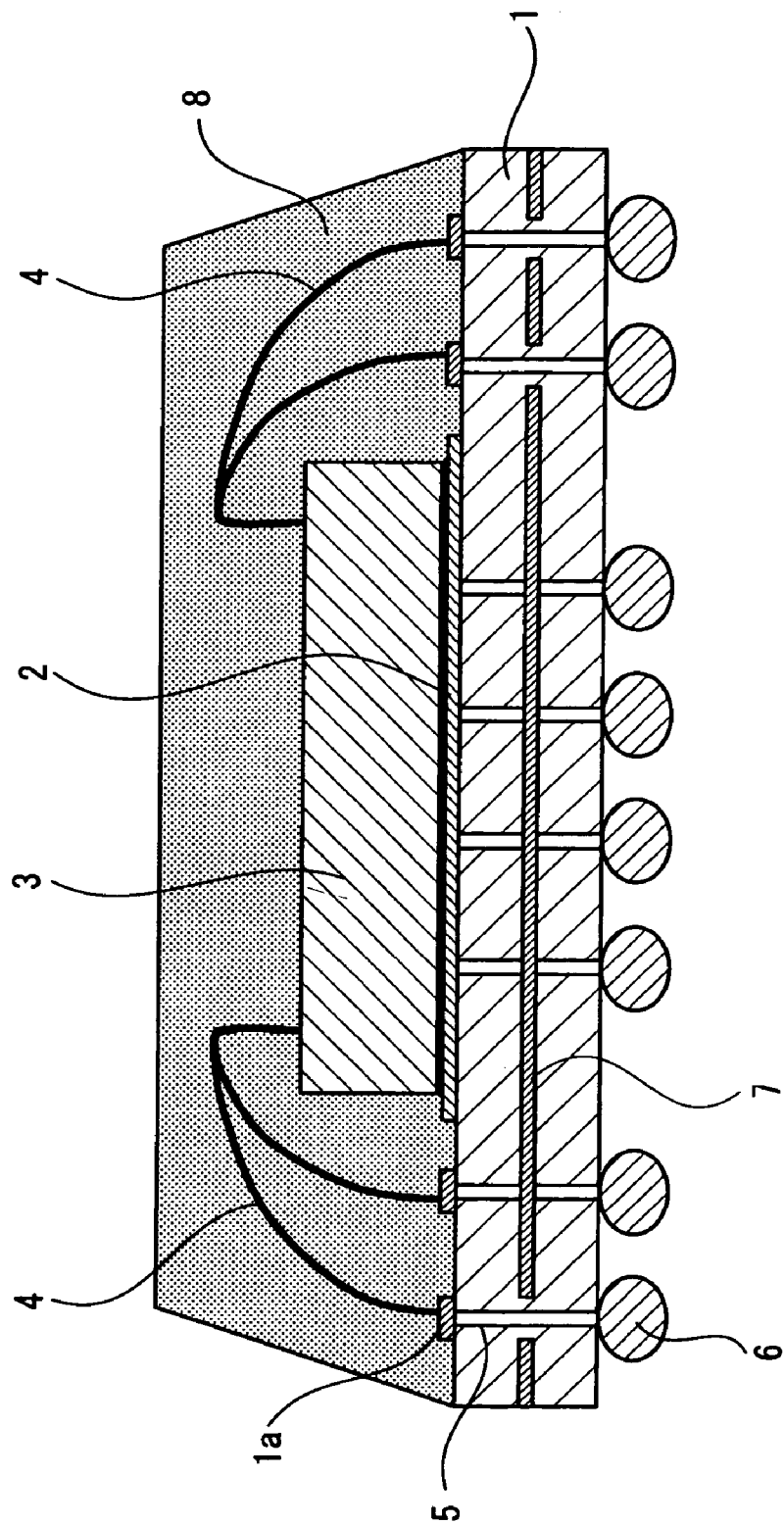
FIG. 5 is a cross-sectional view showing a conventional semiconductor device.

FIG. 4 illustrates the semiconductor device that is different from the semiconductor device shown in FIG. 3 in that the through holes 5 connected to the heat sink 2a of the heat sink 2 are connected to the solid wiring 7a of the first inner wiring layer 7, and the through holes 5 connected to the heat sink 2b are connected to a solid wiring 12a of a second inner wiring layer 12. The solid wiring 7a is a GND wiring and the solid wiring 12a is a power supply wiring.

In this semiconductor device, the heat generated by operating the semiconductor element 3 is conducted to the heat sinks 2a and 2b from the back surface of the semiconductor element 3 through the insulating adhesive 11, and then further conducted through: a conduction path for conducting the heat from the heat sink 2a via the through holes 5 to the external electrodes 6 at the respective ends thereof, another conduction path for conducting the heat from the heat sink 2a via the through holes 5 and the solid wiring 7a to different through holes 5 and then to the external electrodes 6, still another conduction path for conducting the heat from the heat sink 2b through the via holes 5 to the external electrodes 6 at the respective ends thereof, and yet another conduction path for conducting the heat from the heat sink 2b via the through holes 5 and the solid wiring 12a to different through holes 5 and then to the external electrodes 6. As described above, the number of conduction paths increases, and therefore it is possible to obtain heat dissipation effect even higher than that of the semiconductor device of FIG. 3. In addition, the thermal fatigue of the external electrodes 6 is reduced, and reliability can be improved.

The semiconductor of FIG. 4 allows electrical independence of the through holes 5 respectively connected to one of the divided heat sinks 2a, 2b to be maintained, and thus the number of the heat conduction paths can be increased even with the through holes of the same number as the semiconductor device of FIG. 3. The number into which the heat sink 2 is divided should correspond to the number of connection targets (solid wiring 7a, 12a etc.) of different potentials.

Each semiconductor device of FIG. 1 to FIG. 4 is a BGA semiconductor device that protects an integrated circuit section of the semiconductor element (LSI chip) and stably ensures electrical connection with the external device, and further, that allows high density mounting. In such a BGA semiconductor device as well as in a similar semiconductor device in which a land or a bump not in a ball shape is formed as the external electrodes 6, the thermal resistance can be reduced and the mounting reliability can be improved, especially when mounting the semiconductor element of large power consumption.

The above described semiconductor devices has the beneficial effects in use of information communication devices, office electronics, household electronics, measuring devices, industrial electronics such as assembling robots, medical electronics, electronic toys, and the like.

What is claimed is:

1. A semiconductor device comprising:
   a wiring substrate;
   a first heat sink and a second heat sink on the wiring substrate;
   a semiconductor element on an insulating layer, which is on both the first heat sink and the second heat sink;
   a first and second wire electrically connecting the wiring substrate and the semiconductor element;
   a first throughhole in the wiring substrate connected to the first heat sink;
   a second throughhole in the wiring substrate connected to the second heat sink;
   a third throughhole in the wiring substrate connected to the first wire;
   a fourth throughhole in the wiring substrate connected to the second wire;
   a first wiring in the wiring substrate;
   a second wiring in the wiring substrate; and
   an external electrode on a back surface of the wiring substrate and connected to at least one of the first, second, third, and fourth throughholes,
   wherein the first wiring is connected to both the first throughhole and the third throughhole, and
   the second wiring is connected to both the second throughhole and the fourth throughhole.

2. The semiconductor device according to claim 1, wherein the insulating layer is an insulating adhesive layer for adhering the semiconductor element to at least one of the first and second heat sinks.

3. The semiconductor device according to claim 1, wherein at least one of the first heat sink and the second heat sink is electrically connected to a GND wiring or a power supply wiring.

4. The semiconductor device according to claim 1, wherein the insulating layer between both the first heat sink and the second heat sink and the semiconductor element provides electrical isolation between both of the heat sinks and the semiconductor element.

* * * * *